(12) United States Patent
Morgan

(10) Patent No.: US 6,801,073 B2
(45) Date of Patent: Oct. 5, 2004

(54) SYSTEM, CIRCUIT AND METHOD FOR LOW VOLTAGE OPERABLE, SMALL FOOTPRINT DELAY

(75) Inventor: Donald M. Morgan, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/179,606

(22) Filed: Jun. 25, 2002

(65) Prior Publication Data

US 2003/0234674 A1 Dec. 25, 2003

(51) Int. Cl.⁷ ............................................... H03H 11/26
(52) U.S. Cl. ...................................... 327/290; 327/288
(58) Field of Search .................................. 327/290, 288, 327/285, 268, 264, 261, 206, 205; 326/95, 90, 87, 86, 83; 331/51

(56) References Cited

U.S. PATENT DOCUMENTS

| | | | | |
|---|---|---|---|---|
| 3,808,411 A | * | 4/1974 | Hoffmann | 708/802 |
| 4,464,587 A | * | 8/1984 | Suzuki et al. | 327/206 |
| 5,175,445 A | * | 12/1992 | Kinugasa et al. | 326/87 |
| 5,694,090 A | | 12/1997 | Morgan | 331/57 |
| 5,767,728 A | * | 6/1998 | Michail et al. | 327/374 |
| 5,898,343 A | | 4/1999 | Morgan | 331/57 |
| 5,920,221 A | | 7/1999 | Shen et al. | 327/264 |
| 5,936,451 A | | 8/1999 | Phillips et al. | 327/285 |
| 5,936,479 A | | 8/1999 | Morgan et al. | 331/111 |
| 6,044,026 A | | 3/2000 | Morgan | 365/194 |
| 6,094,104 A | | 7/2000 | Morgan | 331/57 |
| 6,118,303 A | | 9/2000 | Schmitt et al. | 326/83 |
| 6,175,526 B1 | | 1/2001 | Morgan | 365/194 |
| 6,304,150 B1 | | 10/2001 | Shenoy | 331/57 |
| 6,445,643 B2 | * | 9/2002 | Keeth et al. | 365/233 |
| 2002/0145923 A1 | * | 10/2002 | Dietrich et al. | 365/200 |

OTHER PUBLICATIONS

SLDRAM Inc., Draft/Advance, SLD4M18DR400 4 MEG x 18 SLDRAM, 400 Mb/s/pin SLDRAM, 1998, pp. 1–69.
Internal Design Specification, Advance, 144 MEG: x18 SLDRAM, 800 Mb/s/pin SLDRAM, 1999, pp. 1–32.
Advance MT49V4M16B 4MEG x 16 SLDRAM, 400 Mb/s/pin SLDRAM, 1998, pp. 1–2.
MT49V4M16B 4MEG x 16 SLDRAM, 1998, 69 pages.

* cited by examiner

Primary Examiner—Timothy P. Callahan
Assistant Examiner—Linh M. Nguyen
(74) Attorney, Agent, or Firm—TraskBritt

(57) ABSTRACT

The present invention is a system, circuit and method for low voltage operable, small footprint delay. The delay circuit of the present invention uses an input switching configuration with a limited gate to source conductance to enhance the delay time for any given resistor and capacitor area in an RC network. According to the delay circuit of the present invention, the output of the RC network transitions very slowly in order to achieve a long delay. When the next stage of the delay circuit trips, the limited gate to source conductance is bypassed to allow rapid full rail presetting or resetting on the output of the RC network. This rapid full rail presetting or resetting limits power consumption and rapidly prepares the delay circuit for the next edge transition or cycle. Methods and systems incorporating the delay circuit and techniques of the present invention are also disclosed.

41 Claims, 8 Drawing Sheets ical delay circuit 100 because the internal delay must
SYSTEM, CIRCUIT AND METHOD FOR LOW VOLTAGE OPERABLE, SMALL FOOTPRINT DELAY

TECHNICAL FIELD

This invention relates generally to integrated circuit delay elements. More particularly, the invention relates to a system, circuit and method for low voltage operable, small footprint delay.

BACKGROUND OF THE INVENTION

Synchronous integrated circuits rely on precise timing to operate properly. Frequently, there is a need to delay one or more signals to compensate for delays along other signal paths in an integrated circuit. Delay circuits are well known to one of ordinary skill in the art. Perhaps the simplest conventional delay circuit consists of a resistor and capacitor in series (RC network). The RC network consists of an input at one end of the resistor and the output at the other end of the resistor. The capacitor has one node connected to the output and the other node connected to ground potential. At steady state, a low voltage on the input results in a low voltage across the capacitor and at the output. If the input abruptly changes from low to high, the output remains low initially as the capacitor charges up and the voltage on the output rises to a high. Eventually the output will be at a high voltage matching the input voltage. Conversely, as the input voltage abruptly changes to a low voltage, the capacitor initially holds the output at a high. As the capacitor discharges through the resistor, the voltage across the capacitor, output, begins to drop and eventually matches the low voltage on the input. In this way the inherent delay of the RC network is used to delay an input signal at the corresponding output.

FIG. 1 illustrates a conventional delay circuit 100 suitable for use with digital integrated circuits that incorporates an RC network. The terms "tied", "coupled" and "connected" are used synonymously herein. Delay circuit 100 includes a p-channel metal oxide semiconductor (PMOS) transistor P1 with a source tied to power, $V_{DD}$, and a gate tied to ground, GND. Delay circuit 100 further includes a PMOS transistor P2 with a source node tied to a drain node of PMOS transistor P1 and a drain node tied to a first end of resistor R. Delay circuit 100 further includes an n-channel metal oxide semiconductor (NMOS) transistor N1 with a drain node connected to the first end of resistor R and a gate node connected to input signal, IN, and a gate node of PMOS transistor P2. Delay circuit 100 further includes an NMOS transistor N2 having a drain node connected to the source node of NMOS transistor N1, a gate node coupled to $V_{DD}$ and a source node tied to ground potential, GND. Delay circuit 100 further includes a capacitor C1 with one end tied to signal A and the other end tied to resistor R. Delay circuit 100 further includes an inverter 102 with input connected to signal A and an output driving output signal B.

FIG. 2 illustrates a timing diagram showing input signal IN relative to signal A and output signal B for the conventional delay circuit 100 shown in FIG. 1. As shown in FIG. 2, delay circuit 100 achieves a delay, $t_{d1}$, for a rising edge in the input signal IN to appear on output signal B. However, there is a significant internal delay, $\Delta t_1$, in fully discharging (or charging) capacitor C1 as illustrated by signal A in FIG. 2. This internal delay limits the switching speed of conventional delay circuit 100 because the internal delay must expire before the next transition on input signal IN. Otherwise, the duration of delay generated by the delay circuit 100 may be unpredictable if signal A starts from some voltage other than a rail voltage, i.e., $V_{DD}$ or GND. Thus, for high frequency applications, it is desirable for the internal node of a delay circuit to quickly return to a rail voltage after the delayed output signal is achieved. Additionally, such a conventional delay network 100 is typically placed many times on a typical IC. Since the time delay is dependant on the values of the resistor R1 and capacitor C1 and the resistor and capacitor elements are relatively large, long delay times can be costly in terms of IC area or "real estate."

Thus, there exists a need in the art for a system, circuit and method for low voltage operable, small footprint delay that achieves signal delays useful for high-speed applications requiring less IC real estate than conventional delay circuits.

SUMMARY OF THE INVENTION

The present invention includes a system, circuit and method for low voltage operable, small footprint delay. Delay circuits according to the present invention may include input switching and output switching devices separated by an RC network. The input switching devices may be coupled to limiting devices. Furthermore, bypass devices may be coupled to the limiting devices to rapidly precondition internal signals of the delay circuit. Preconditioning internal signals enables higher frequency operation of the delay circuits of the present invention relative to conventional delay circuits. Additional features of the delay circuits of the present invention include programmable resistance networks and programmable capacitance networks allowing precise control of the delay generated by the RC network formed by same.

These embodiments of the present invention will be readily understood by reading the following detailed description in conjunction with the accompanying figures of the drawings.

BRIEF DESCRIPTION OF THE DRAWINGS

The drawings illustrate exemplary embodiments of the present invention. Additionally, like reference numerals refer to like parts in different views or embodiments in the drawings.

DETAILED DESCRIPTION OF THE INVENTION

The present invention includes a system, circuit and method for low voltage operable, small footprint delay. The delay circuit of the present invention uses an input switching configuration with a limited gate to source conductance to enhance the delay time for any given resistor and capacitor area in an RC network. According to the delay circuit of the present invention, the output of the RC network transitions very slowly in order to achieve a long delay. When the next stage of the delay circuit trips, the limited gate to source conductance is bypassed to allow rapid full rail presetting or resetting on the output of the RC network. This rapid full rail presetting or resetting (pre-conditioning) limits power consumption and rapidly prepares the delay circuit for the next edge transition or cycle. Methods and systems incorporating the delay circuit and techniques of the present invention are also disclosed. The terms "signal" and "node" may be used interchangeably herein.

Figure 3:
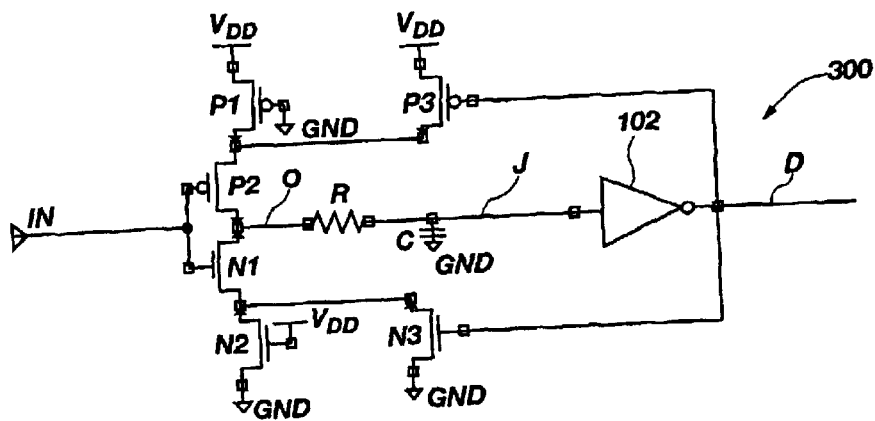
FIG. 3 is a circuit diagram of an embodiment of a delay circuit in accordance with the present invention.

FIG. 3 is a circuit diagram of an embodiment of a delay circuit 300 in accordance with the present invention. Delay circuit 300 may include a PMOS transistor P1 with a source tied to power, $V_{DD}$, and a gate tied to ground, GND. Delay circuit 300 may further include a PMOS transistor P2 with a source node tied to a drain node of PMOS transistor P1 and a drain node tied to a first end of resistor R. Delay circuit 300 may further include an NMOS transistor N1 with a drain node connected to the first end of resistor R and a gate node connected to input signal, IN and a gate node of PMOS transistor P2. Delay circuit 300 may further include an NMOS transistor N2 having a drain node connected to the source node of NMOS transistor N1, a gate node coupled to power, $V_{DD}$, and a source node tied to ground potential, GND. Delay circuit 300 may further include a capacitor C with one end tied to signal J and to the other end of resistor R. Delay circuit 300 may further include an inverter 102 with input connected to signal J and output driving output signal D.

Resistor R in series with capacitor C may be referred to herein as an "RC network." PMOS transistor P2 and NMOS transistor N1 form an inverter with input signal IN and output, intermediate signal O. The inverter formed by PMOS transistor P2 and NMOS transistor N1 may be referred to as an "input switching device" and the output of the input switching device may be referred to as an "intermediate signal O," herein. The output of the RC network, signal J, may be referred to herein as a "delayed intermediate signal". Similarly, inverter 102 may be referred to herein as an "output switching device" herein. PMOS transistor P1 may be referred to as a "limiting device" because it limits the conductance of PMOS transistor P2, thereby enhancing the delay provided by the RC network during falling edge transitions on the input signal IN. Similarly, NMOS transistor N2 may also be referred to as a limiting device because it limits the conductance of NMOS transistor N1 during rising edge transitions on the input signal IN.

Delay circuit 300 may further include a PMOS transistor P3 coupled to PMOS transistor P1. More specifically, PMOS transistor P3 has a source node coupled to power, $V_{DD}$, a drain node coupled to the drain node of PMOS transistor P1 and a gate node coupled to output signal D. PMOS transistor P3 may be referred to herein as a bypass device because it enables rapid pre-charging of the intermediate signal O and the delayed intermediate signal J by effectively bypassing the limiting device, PMOS transistor P1 when the output signal is high.

Delay circuit 300 may further include an NMOS transistor N3 coupled to NMOS transistor N2. More specifically, NMOS transistor N3 has a source node coupled to ground potential, GND, a drain node coupled to the drain node of NMOS transistor N2 and a gate node coupled to output signal D. NMOS transistor N3 may be referred to herein as a bypass device because it enables rapid resetting of the intermediate signal O and the delayed intermediate signal J by effectively bypassing the limiting device, NMOS transistor N2 when the output signal is low.

Figure 2:
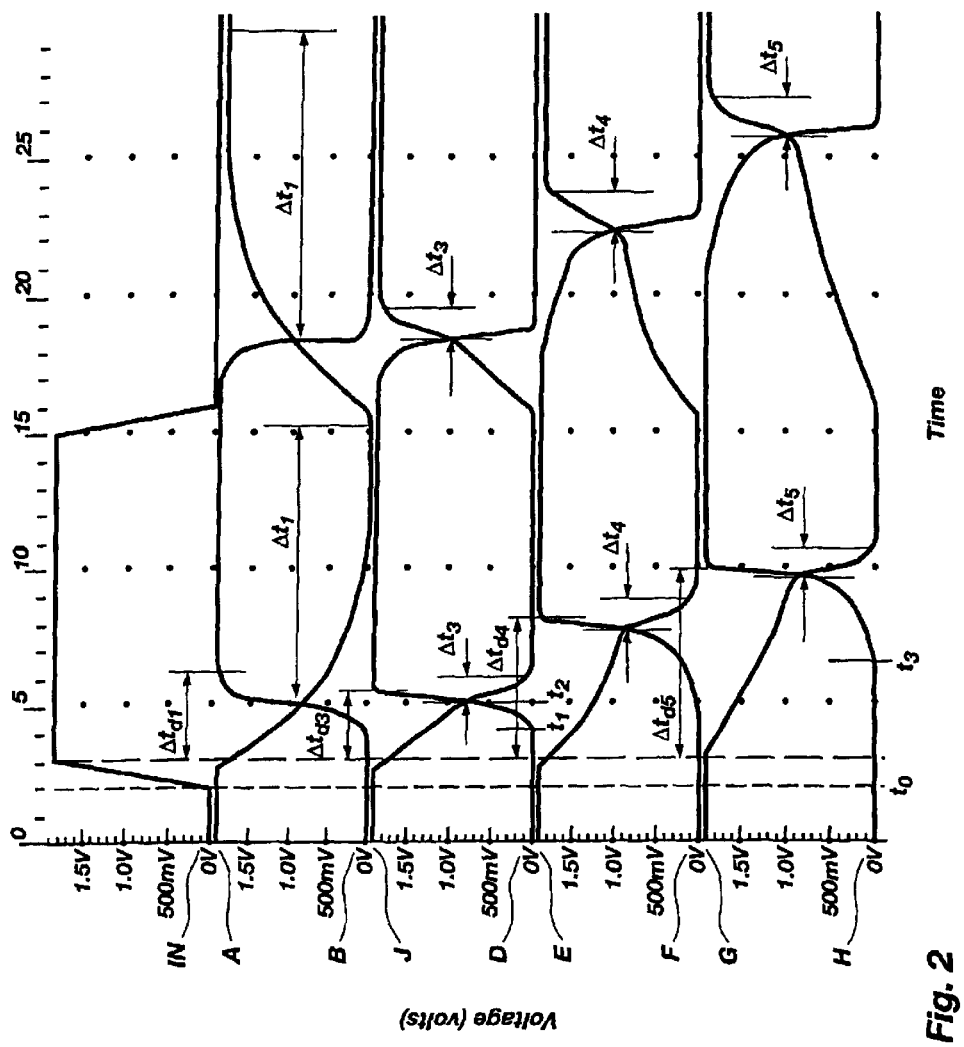
FIG. 2 is a timing diagram for the conventional delay circuit of FIG. 1 and also the delay circuits of the present invention as illustrated in FIGS. 3–4.

Referring again to FIG. 2, the operation of delay circuit 300 is elaborated herein. FIG. 2 illustrates delayed internal signal J and output signal D in response to input signal IN. At time $t_0$, input signal IN is low, PMOS transistors P2 and P3 are turned on, NMOS transistor N1 is turned off, PMOS transistor P1 and NMOS transistor N2 are always turned on, NMOS transistor N3 is turned off, the delayed intermediate signal J is high, capacitor C is fully charged and output signal D is low. As input signal IN transitions from a low to a high state, PMOS transistor P2 begins to turn off and NMOS transistor N1 begins to turn on. As NMOS transistor N1 begins to turn on, the input to the RC network, intermediate signal O is pulled to ground potential, GND, through NMOS transistors N1 and N2. This allows the charge on capacitor C to discharge through resistor R through NMOS transistors N1 and N2. At time $t_1$, delayed intermediate signal J drops low enough to trip the output stage, inverter 102, thereby causing the output signal D to rise. At time $t_2$, output signal D is low enough to turn on bypass device, NMOS transistor N3, rapidly discharging any remaining charge left on capacitor C. One of ordinary skill in the art will recognize that a falling edge transition on input signal IN has a similar mirror image response for delay circuit 300 because of the symmetry of delay circuit 300, and thus will not be further elaborated herein.

Figure 1:
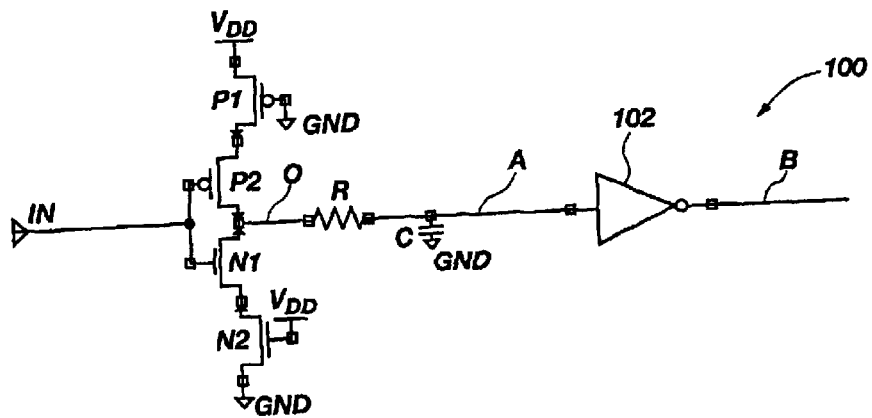
FIG. 1 is a circuit diagram of a conventional delay circuit.

The duration of the rapid discharging and charging are denoted on FIG. 2 by time delays, $\Delta t_3$, which are noticeably shorter than the time delays, $\Delta t_1$, of the conventional delay circuit 100 of FIG. 1. It is important to note that the rapid discharging and charging of capacitor C, as measured by $\Delta t_3$, and facilitated by the bypass devices, PMOS transistor P3 and NMOS transistor N3, allows for significantly faster operation of the delay circuit 300 of the present invention relative to the conventional delay circuit 100. This is because the internal signal O and delayed internal signal J are rapidly "pre-conditioned" to the rail voltages, power, VDD, and ground potential, GND, by the bypass devices, PMOS transistor P3 and NMOS transistor N3, allowing the next cycle (edge transitions) to occur sooner.

Additionally, the duration of the delay for the rising edge of input signal IN, as measured by $\Delta t_{d3}$, of delay circuit 300 is comparable to the duration of the delay $\Delta t_{d1}$, of delay circuit 100 for the rising edge of input signal IN. Thus, faster operation is achieved while maintaining comparable duration of input signal delay. Even greater durations of delay, $\Delta t_{d4}$ and $\Delta t_{d5}$, may be achieved, while maintaining rapid pre-conditioning for high speed operation, with the following additional embodiments of the delay circuit 400 and 500 as detailed below.

Figure 4:
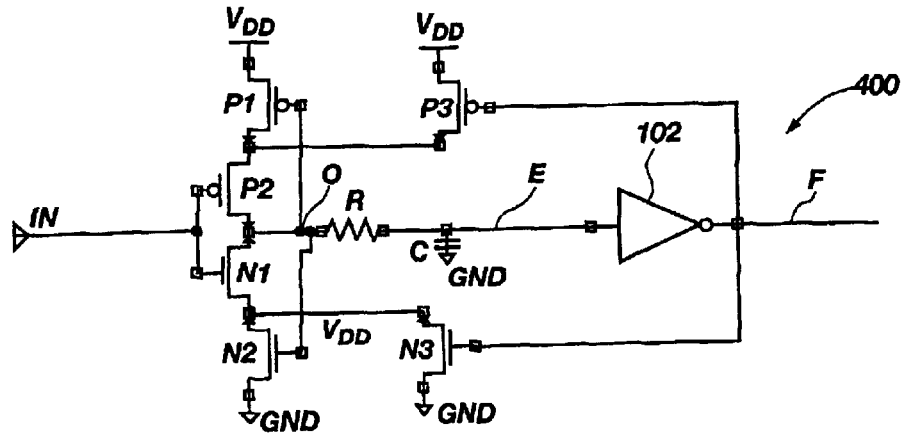
FIG. 4 is a circuit diagram of another embodiment of a delay circuit in accordance with the present invention.

FIG. 4 is a circuit diagram of another embodiment of a delay circuit 400 in accordance with the present invention. Delay circuit 400 is similar to delay circuit 300 except for the gates of limiting devices, PMOS transistor P1 and NMOS transistor N2. The gate nodes of both PMOS transistor P1 and NMOS transistor N2 are coupled to internal signal O of delay circuit 400.

This gate configuration of limiting devices, PMOS transistor P1 and NMOS transistor N2, for delay circuit 400 further limits the conductance of the switching devices, PMOS transistor P2 and NMOS transistor N1, relative to the gate configuration of delay circuit 300. The conductance of the switching devices, PMOS transistor P2 and NMOS transistor N1, is further limited because limiting device, NMOS transistor N2 gradually becomes less conductive as input signal IN transitions from low to high, rather than being permanently turned fully on as in delay circuit 300. Conversely, for a falling edge on input signal IN, PMOS transistor P1 gradually turns off as input signal IN transitions from high to low, rather than being permanently turned fully on as in delay circuit 300.

Referring again to FIG. 2, delayed internal signal E and output signal F are shown in response to input signal IN. The rapid discharging and charging of capacitor C, as measured by $\Delta t_4$, and facilitated by the bypass devices, PMOS transistor P3 and NMOS transistor N3, allows for significantly faster operation of delay circuit 400 of the present invention relative to the conventional delay circuit 100. It is also important to note that the overall duration of the delay of the rising edge of the input signal IN, as measured by $\Delta t_{d4}$ is even longer in duration than for the convention delay circuit 100 as measured by $\Delta t_{d1}$.

Figure 5:
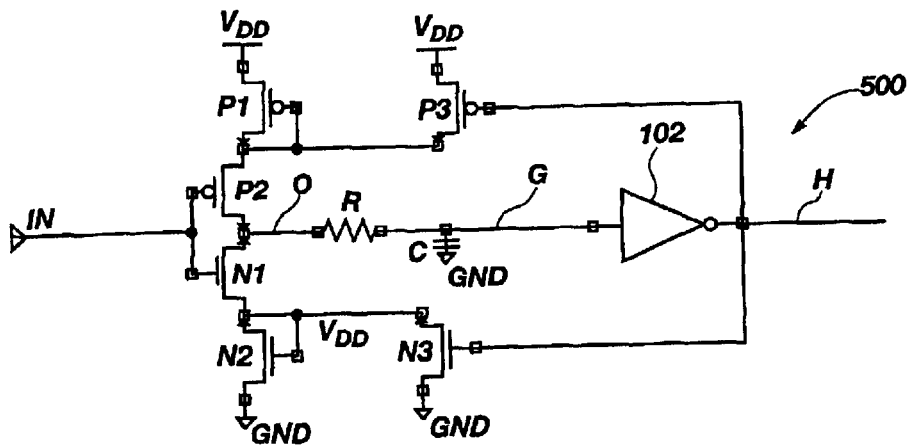
FIG. 5 is a circuit diagram of yet another embodiment of a delay circuit in accordance with the present invention.

FIG. 5 is a circuit diagram of yet another embodiment of a delay circuit 500 in accordance with the present invention. Delay circuit 500 is also similar to delay circuits 300 and 400 except for the gates of limiting devices, PMOS transistor P1 and NMOS transistor N2. The gate node of PMOS transistor P1 is coupled to the drain node of PMOS transistor P1 and the source node of PMOS transistor P2. Similarly, the gate node of NMOS transistor N2 is coupled to the drain node of NMOS transistor N2 and to the source node of NMOS transistor N1.

For delay circuit 500, the common gate-drain biasing of limiting devices, PMOS transistor P1 and NMOS transistor N2, even further limits the conductance of the switching devices, PMOS transistor P2 and NMOS transistor N2, relative to the gate configuration of delay circuit 400. Referring once again to FIG. 2, delayed internal signal G and output signal H are shown in response to input signal IN.

The conductance of the switching devices, PMOS transistor P2 and NMOS transistor N1, is further limited because limiting devices, PMOS transistor P1 and NMOS transistor N2, operate with gate-to-source voltage at conduction threshold, thereby limiting current. After time $t_0$, charge from capacitor C attempts to discharge through NMOS transistors N1 and N2. However, NMOS transistor N2 limits the current flowing to ground because of its common gate-drain biasing. Beginning at time $t_3$, output signal H begins to rise, turning off PMOS transistor P3 and turning on NMOS transistor N3, rapidly completing the discharge of capacitor C during time duration measured as the left $\Delta t_5$. It is also important to note the overall delay of the rising edge of input signal IN as reflected by output signal H and measured by time delay $\Delta t_{d5}$. It is significant that all of the time delays, $\Delta t_{d3}$, $\Delta t_{d4}$ and $\Delta t_{d5}$, are achieved by only two additional transistors and without increasing the size of resistor R or capacitor C relative to the conventional delay circuit 100. It is also important to note that the time delay achieved by the delay circuits 300, 400 and 500 is comparable or longer than that of the conventional delay circuit 100, while using smaller combinations of resistor and capacitor elements and, thus, saving IC area or "real estate" versus the conventional delay circuit 100.

Figure 6:
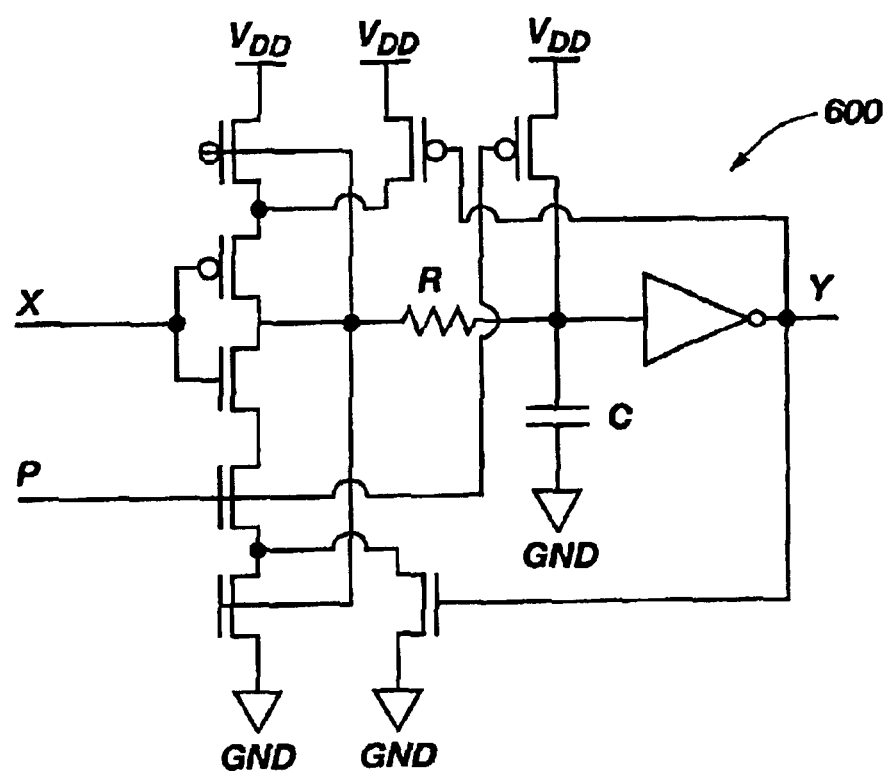
FIG. 6 is a circuit diagram for even yet another embodiment of a delay circuit in accordance with the present invention.

FIG. 6 illustrates yet another embodiment of a delay circuit 600 according to the present invention. Delay circuit 600 has an output signal Y, input signal X and input signal P. Both rising and falling edges of input signal X will be delayed at output signal Y. However, only the rising edge of input signal P will be delayed at output signal Y. The gate configuration of the limiting devices of delay circuit 600 is similar to the gate configuration of the limiting devices of delay circuit 400. Of course other gate configurations for the limiting devices of delay circuit 600, such as those shown for delay circuits 300 and 500, are also applicable to the delay circuit 600. The operational aspects of delay circuit 600 as shown in FIG. 6 are within the knowledge of one of ordinary skill in the art, thus, no further explanation will be elaborated herein.

Figure 7:
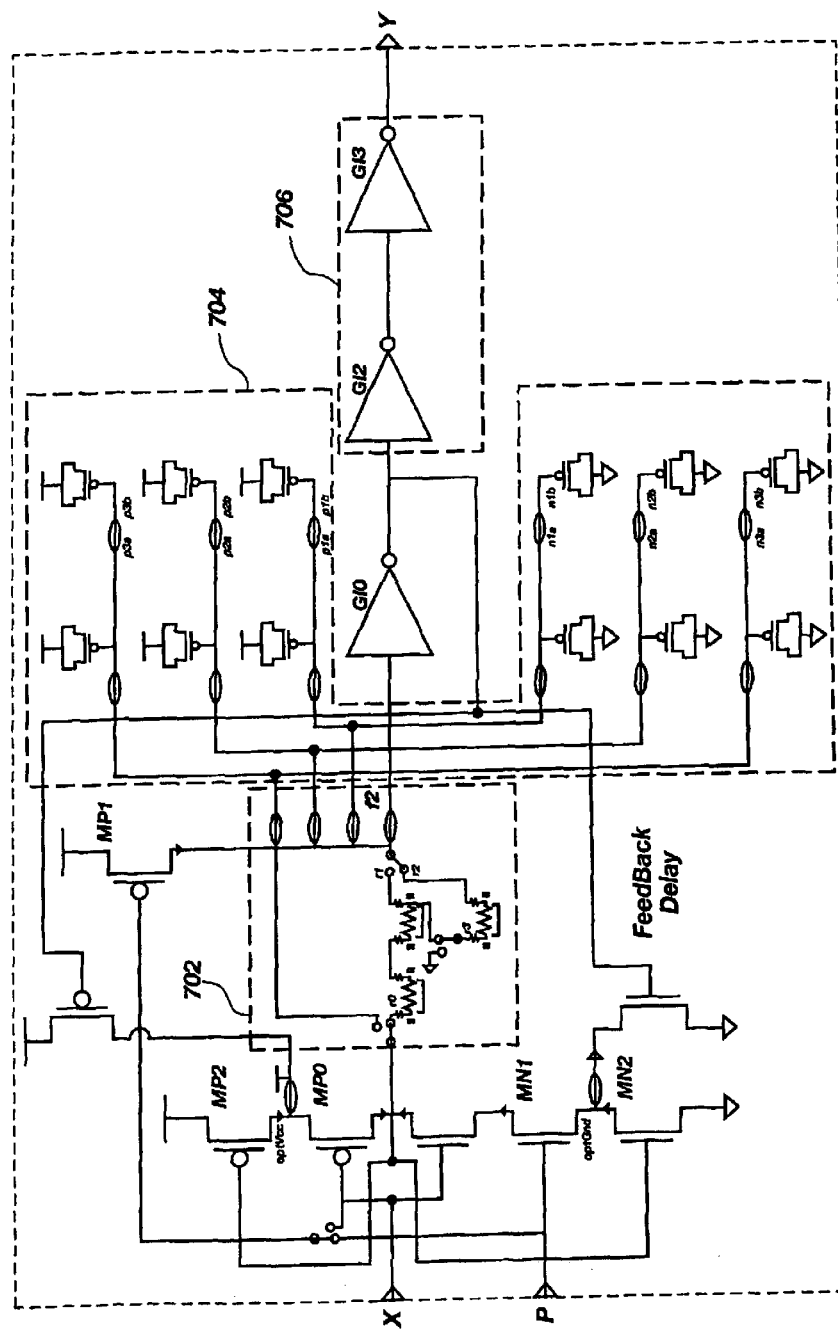
FIG. 7 is a circuit diagram of a more sophisticated delay circuit 700 based on the operation of the delay circuit illustrated in FIG. 6.

FIG. 7 is a circuit diagram of a more sophisticated delay circuit 700 based on the operation of delay circuit 600. Delay circuit 700 has a structure similar to delay circuit 600 with additional features. Delay circuit 700 has an output signal Y, input signal X and input signal P like delay circuit 600. Both rising and falling edges of input signal X will be delayed at output signal Y. However, only the rising edge of input signal P will be delayed at output signal Y. Delay circuit 700 also has a programmable resistance network 702, a programmable capacitance network 704 and an additional output stage 706. The programmable resistance network 702 and programmable capacitance network 704 allows for customizing the delay generated by an RC network formed of programmable resistance network 702 and programmable capacitance network 704. The gate configuration of the limiting devices of delay circuit 700 is similar to the gate configuration of the limiting devices of delay circuit 400. Of course, other gate configurations for the limiting devices of delay circuit 700, such as those shown for delay circuits 300 and 500, are also applicable to the delay circuit 700. The operational aspects of delay circuit 700 as shown in FIG. 7 are within the knowledge of one of ordinary skill in the art, thus, no further explanation will be elaborated herein.

Figure 8:
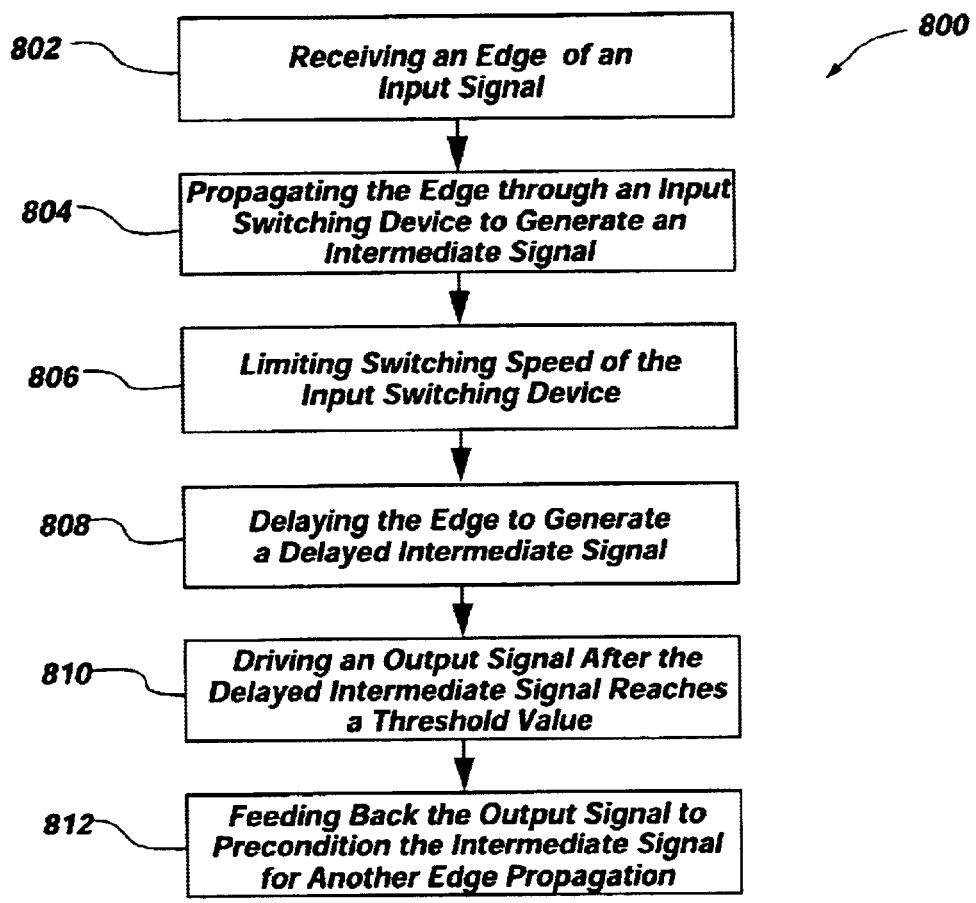
FIG. 8 is a flow chart of a method for delaying a signal in accordance with the present invention.

FIG. 8 is a flow chart of a method 800 for delaying an input signal in accordance with the present invention. Method 800 may include receiving an edge of an input signal, propagating the edge through an input switching device to generate an intermediate signal and limiting the switching speed of the input switching device. Method 800 may further include delaying edge to generate a delayed intermediate signal, driving an output signal after the delayed intermediate signal reaches a threshold voltage and feeding back the output signal to pre-condition the intermediate signal for another edge propagation. Method 800 may further include selectively programming the resistance and/or capacitance of an RC network coupled to the input switching device to precisely adjust the delay of the output signal.

Figure 9:
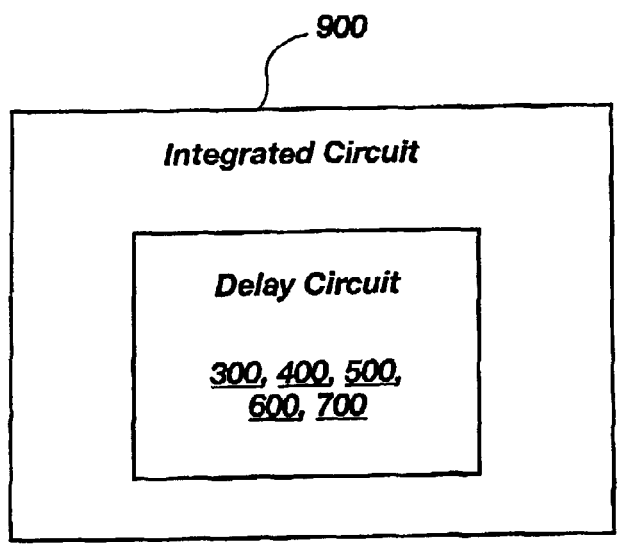
FIG. 9 is a block diagram of an integrated circuit including a delay circuit in accordance with the present invention.

The delay circuits 300, 400, 500, 600, and 700 of the present invention may be used in any higher-order digital logic device or integrated circuit (IC) requiring a signal delay. FIG. 9 is a block diagram of an IC 900 including a delay circuit 300, 400, 500, 600, and 700 in accordance with the present invention. As noted above, IC 900 may be a processor, a memory device, control logic or any other integrated circuit requiring a signal delay. An IC memory device may be, for example and not by way of limitation, a dynamic random access memory (DRAM), double data rate SDRAM (DDR SDRAM), RAMBUS® DRAM (RDRAM®), extended data-out DRAM (EDO DRAM), fast-page-mode DRAM (FPM DRAM), static random access memory (SRAM), SyncBurst™ SRAM, Zero Bus Turnaround™ SRAM (ZBT™ SRAM), Quad Data Rate™ SRAM (QDR™ SRAM), DDR synchronous SRAM (DDR SRAM) and nonvolatile electrically block-erasable programmable read only memory (Flash).

Figure 10:
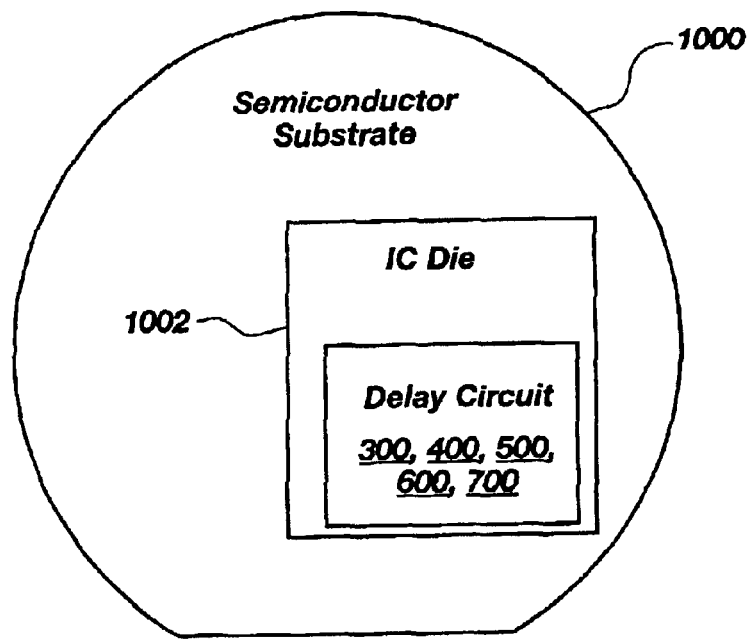
FIG. 10 is a plan view of a semiconductor substrate including a delay circuit in accordance with the present invention.

Referring to FIG. 10, a plan view of a semiconductor substrate 1000 including at least one integrated circuit die 1002 (only one of which is shown for clarity). Each integrated circuit die 1002 includes at least one delay circuit 300, 400, 500, 600, and/or 700 in accordance with the present invention. Integrated circuit die 1002 may be a memory device as described above, or it may be any other integrated circuit die that includes a delay circuit 300, 400, 500, 600, and/or 700 of the present invention. Semiconductor substrate 1000 may be a silicon wafer or other large-scale substrate comprising a layer of semiconductor material.

Figure 11:
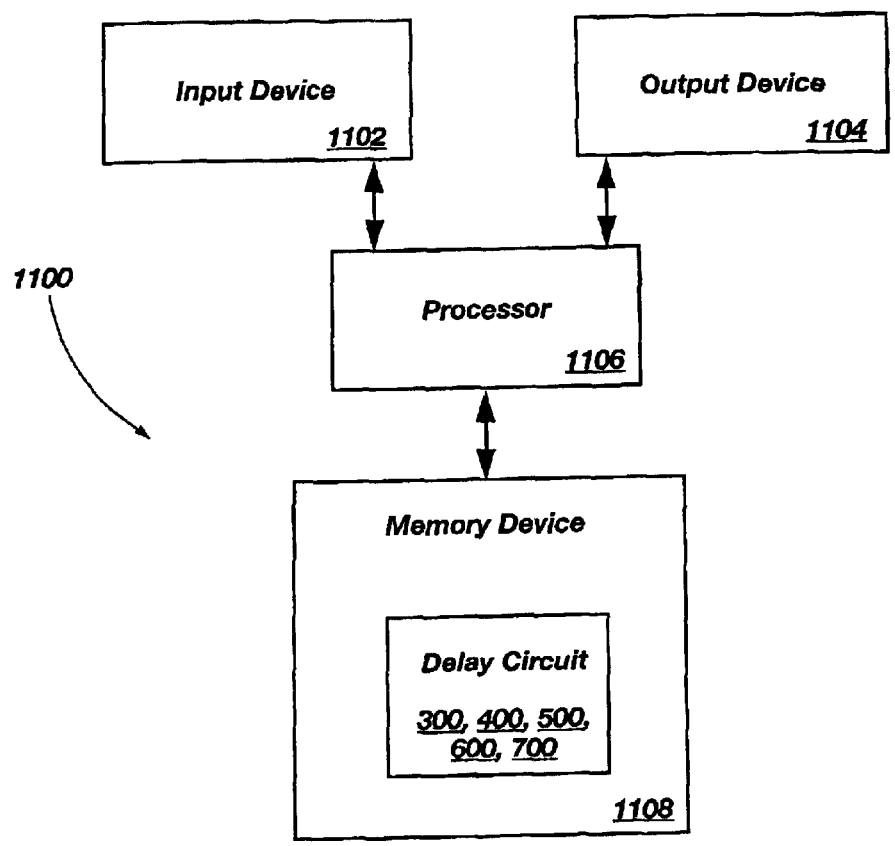
FIG. 11 is a block diagram of a system including a delay circuit in accordance with the present invention.

Referring to FIG. 11, a block diagram of a computer system 1100 incorporating at least one delay circuit 300, 400, 500, 600, 700 in accordance with the present invention is shown. Computer system 1100 includes an input device 1102, an output device 1104, a processor 1106 connected to the input device 1102 and the output device 1104 and a memory device 1108 connected to the processor 1106. The memory device 1108 may include a delay circuit 300, 400, 500, 600, 700 of the present invention. Memory device 1108 may be, for example and not by way of limitation a dynamic random access memory (DRAM), double data rate SDRAM (DDR SDRAM), RAMBUS® DRAM (RDRAM®), extended data-out DRAM (EDO DRAM), fast-page-mode DRAM (FPM DRAM), static random access memory (SRAM), SyncBurst™ SRAM, Zero Bus Turnaround™ SRAM (ZBT™ SRAM), Quad Data Rate™ SRAM (QDR™ SRAM), DDR synchronous SRAM (DDR SRAM) and nonvolatile electrically block-erasable programmable read only memory (Flash), as described above.

The semiconductor technology employed is not a limiting factor in the application of the delay circuits of the present invention. While silicon is the preferred bulk semiconductor material for commercial electronic devices, gallium arsenide and indium phosphide substrates may also be employed. Of course, it will be understood that the skewed logic devices of the present invention may be fabricated on other semiconductor substrates as well, including, for example, silicon-on-glass (SOG) substrates, silicon-on-insulator (SOI) substrates, and silicon-on-sapphire (SOS) substrates.

Although this invention has been described with reference to particular embodiments, the invention is not limited to these described embodiments. For example, the lower rail voltage used with the present invention may be a constant voltage potential, less than $V_{DD}$ and other than ground potential, GND, as illustrated herein. The invention is limited only by the appended claims, which include within their scope all equivalent devices or methods that operate according to the principles of the invention as described herein.

What is claimed is:

1. A delay circuit comprising:
   an input switching device for receiving an input signal and outputting an intermediate signal;
   a first limiting device controlled by said intermediate signal and coupled to said input switching device for limiting speed of falling edge transitions from said input signal through said input switching device;
   a second limiting device controlled by said intermediate signal and coupled to said input switching device for limiting speed of rising edge transitions from said input signal through said input switching device;
   an RC network for receiving said intermediate signal and outputting a delayed intermediate signal;
   an output switching device for receiving said delayed intermediate signal and outputting an output signal;
   a first bypass device coupled to said first limiting device and said output signal for bypassing said first limiting device and presetting said intermediate signal; and
   a second bypass device coupled to said second limiting device and said output signal for bypassing said second limiting device and resetting said intermediate signal.

2. The delay circuit according to claim 1, wherein said RC network comprises a resistor in series with a capacitor, wherein a first end of said resistor is coupled to said intermediate signal and a second end of said resistor is coupled to a first end of said capacitor and said delayed intermediate signal and a second end of said capacitor is coupled to a constant voltage potential.

3. The delay circuit according to claim 2, wherein said constant voltage potential comprises ground potential, GND.

4. The delay circuit according to claim 2, wherein said RC network further comprises selectable resistance and selectable capacitance.

5. The delay circuit according to claim 1, wherein said output switching device comprises an inverter.

6. The delay circuit according to claim 1, wherein said input switching device comprises an inverter.

7. The delay circuit according to claim 6, wherein said inverter comprises:
   a PMOS transistor having a gate node coupled to said input signal and a drain node coupled to said intermediate signal; and
   an NMOS transistor having a gate node coupled to said input signal and a drain node coupled to said intermediate signal.

8. The delay circuit according to claim 7, wherein said first bypass device comprises another PMOS transistor having a source node coupled to power, $V_{DD}$, a gate node coupled to said output signal and a drain node coupled to a source node of said PMOS transistor.

9. The delay circuit according to claim 7, wherein said first limiting device comprises another PMOS transistor having a source node coupled to power, $V_{DD}$, a gate node coupled to ground potential, GND, and a drain node coupled to a source node of said PMOS transistor.

10. A delay circuit comprising:
    an input switching device for receiving an input signal and outputting an intermediate signal, said input switching device comprising an inverter including a PMOS transistor having a gate node coupled to said input signal and a drain node coupled to said intermediate signal and an NMOS transistor having a gate node coupled to said input signal and a drain node coupled to said intermediate signal;
    a first limiting device coupled to said input switching device for limiting speed of falling edge transitions from said input signal through said input switching device, wherein said first limiting device comprises another PMOS transistor having a source node coupled to power, $V_{DD}$, a gate node coupled to said intermediate signal, and a drain node coupled to a source node of said PMOS transistor;
    a second limiting device coupled to said input switching device for limiting speed of rising edge transitions from said input signal through said input switching device;

an RC network for receiving said intermediate signal and outputting a delayed intermediate signal;

an output switching device for receiving said delayed intermediate signal and outputting an output signal;

a first bypass device coupled to said first limiting device and said output signal for bypassing said first limiting device and presetting said intermediate signal; and a second bypass device coupled to said second limiting device and said output signal for bypassing said second limiting device and resetting said intermediate signal.

11. A delay circuit comprising:

an input switching device for receiving an input signal and outputting an intermediate signal, said input switching device comprising an inverter including a PMOS transistor having a gate node coupled to said input signal and a drain node coupled to said intermediate signal and an NMOS transistor having a gate node coupled to said input signal and a drain node coupled to said intermediate signal;

a first limiting device coupled to said input switching device for limiting speed of falling edge transitions from said input signal through said input switching device, wherein said first limiting device comprises another PMOS transistor having a source node coupled to power, $V_{DD}$, a drain node and a gate node both coupled to a source node of said PMOS transistor;

a second limiting device coupled to said input switching device for limiting speed of rising edge transitions from said input signal through said input switching device;

an RC network for receiving said intermediate signal and outputting a delayed intermediate signal;

an output switching device for receiving said delayed intermediate signal and outputting an output signal;

a first bypass device coupled to said first limiting device and said output signal for bypassing said first limiting device and presetting said intermediate signal; and a second bypass device coupled to said second limiting device and said output signal for bypassing said second limiting device and resetting said intermediate signal.

12. The delay circuit according to claim 7, wherein said second bypass device comprises another NMOS transistor having a source node coupled to ground potential, GND, a gate node coupled to said output signal and a drain node coupled to a source node of said NMOS transistor.

13. The delay circuit according to claim 7, wherein said second limiting device comprises another NMOS transistor having a source node coupled to ground potential, GND, a gate node coupled to power, $V_{DD}$, and a drain node coupled to a source node of said NMOS transistor.

14. A delay circuit comprising:

an input switching device for receiving an input signal and outputting an intermediate signal, said input switching device comprising an inverter including a PMOS transistor having a gate node coupled to said input signal and a drain node coupled to said intermediate signal and an NMOS transistor having a gate node coupled to said input signal and a drain node coupled to said intermediate signal;

a first limiting device coupled to said input switching device for limiting speed of falling edge transitions from said input signal through said input switching device;

a second limiting device coupled to said input switching device for limiting speed of rising edge transitions from said input signal through said input switching device, wherein said second limiting device comprises another NMOS transistor having a source node coupled to ground potential, GND, a gate node coupled to said intermediate signal, and a drain node coupled to said source node of said NMOS transistor;

an RC network for receiving said intermediate signal and outputting a delayed intermediate signal;

an output switching device for receiving said delayed intermediate signal and outputting an output signal;

a first bypass device coupled to said first limiting device and said output signal for bypassing said first limiting device and presetting said intermediate signal; and a second bypass device coupled to said second limiting device and said output signal for bypassing said second limiting device and resetting said intermediate signal.

15. A delay circuit comprising:

an input switching device for receiving an input signal and outputting an intermediate signal, said input switching device comprising an inverter including a PMOS transistor having a gate node coupled to said input signal and a drain node coupled to said intermediate signal and an NMOS transistor having a gate node coupled to said input signal and a drain node coupled to said intermediate signal;

a first limiting device coupled to said input switching device for limiting speed of falling edge transitions from said input signal through said input switching device;

a second limiting device coupled to said input switching device for limiting speed of rising edge transitions from said input signal through said input switching device, wherein said second limiting device comprises another NMOS transistor having a source node coupled to ground potential, GND, a drain node and a gate node both coupled to said source node of said NMOS transistor;

an RC network for receiving said intermediate signal and outputting a delayed intermediate signal;

an output switching device for receiving said delayed intermediate signal and outputting an output signal;

a first bypass device coupled to said first limiting device and said output signal for bypassing said first limiting device and presetting said intermediate signal; and a second bypass device coupled to said second limiting device and said output signal for bypassing said second limiting device and resetting said intermediate signal.

16. A method of delaying an input signal comprising:

receiving an edge of said input signal;

propagating said edge through an input switching device to generate an intermediate signal;

limiting switching speed of said input switching device as controlled by said intermediate signal;

delaying said edge to generate a delayed intermediate signal;

driving an output signal after said delayed intermediate signal reaches a threshold voltage; and feeding back said output signal to precondition said intermediate signal for another edge propagation.

17. The method according to claim 16, wherein said propagating said edge through said input switching device comprises switching said edge through an input inverter.

18. The method according to claim 17, wherein said limiting switching speed of said input switching device comprises limiting current through said input inverter.

19. The method according to claim 16, wherein said delaying said edge to generate said delayed intermediate signal comprises propagating said intermediate signal through an RC network.

20. The method according to claim 16, wherein said driving said output signal after said delayed intermediate signal reaches said threshold voltage comprises propagating said delayed intermediate signal through an output inverter to generate said output signal.

21. The method according to claim 16, wherein said feeding back said output signal comprises rapidly setting or resetting said intermediate signal in response to said output signal.

22. A memory device comprising:
a memory array;
a plurality of control signals coupled to said memory array; and
a delay circuit for delaying one of said plurality of control signals, comprising an input signal, said delay circuit comprising:
an input switching device for receiving said input signal and outputting an intermediate signal;
a first limiting device controlled by said intermediate signal and coupled to said input switching device for limiting speed of falling edge transitions from said input signal through said input switching device;
a second limiting device controlled by said intermediate signal and coupled to said input switching device for limiting speed of rising edge transitions from said input signal through said input switching device;
an RC network for receiving said intermediate signal and outputting a delayed intermediate signal;
an output switching device for receiving said delayed intermediate signal and outputting an output signal;
a first bypass device coupled to said first limiting device and said output signal for bypassing said first limiting device and presetting said intermediate signal; and
a second bypass device coupled to said second limiting device and said output signal for bypassing said second limiting device and resetting said intermediate signal.

23. The memory device according to claim 22, wherein said RC network comprises a resistor in series with a capacitor, wherein a first end of said resistor is coupled to said intermediate signal and a second end of said resistor is coupled to a first end of said capacitor and said delayed intermediate signal and a second end of said capacitor is coupled to a constant voltage potential.

24. The memory device according to claim 23, wherein said constant voltage potential comprises ground potential, GND.

25. The memory device according to claim 23, wherein said RC network further comprises selectable resistance and selectable capacitance.

26. The memory device according to claim 22, wherein said output switching device comprises an inverter.

27. The memory device according to claim 22, wherein said input switching device comprises an inverter.

28. The memory device according to claim 27, wherein said inverter comprises:
a PMOS transistor having a gate node coupled to said input signal and a drain node coupled to said intermediate signal; and
an NMOS transistor having a gate node coupled to said input signal and a drain node coupled to said intermediate signal.

29. The memory device according to claim 28, wherein said first bypass device comprises another PMOS transistor having a source node coupled to power, $V_{DD}$, a gate node coupled to said output signal and a drain node coupled to a source node of said PMOS transistor.

30. The memory device according to claim 28, wherein said first limiting device comprises another PMOS transistor having a source node coupled to power, $V_{DD}$, a gate node coupled to ground potential, GND, and a drain node coupled to a source node of said PMOS transistor.

31. A memory device comprising:
a memory array:
a plurality of control signals coupled to said memory array; and
a delay circuit for delaying one of said plurality of control signals, comprising an input signal, said delay circuit comprising:
an input switching device for receiving said input signal and outputting an intermediate signal, said input switching device comprising an inverter including a PMOS transistor having a gate node coupled to said input signal and a drain node coupled to said intermediate signal and an NMOS transistor having a gate node coupled to said input signal and a drain node coupled to said intermediate signal;
a first limiting device coupled to said input switching device for limiting speed of falling edge transitions from said input signal through said input switching device, wherein said first limiting device comprises another PMOS transistor having a source node coupled to power, $V_{DD}$, a gate node coupled to said intermediate signal, and a drain node coupled to a source node of said PMOS transistor;
a second limiting device coupled to said input switching device for limiting speed of rising edge transitions from said input signal through said input switching device;
an RC network for receiving said intermediate signal and outputting a delayed intermediate signal;
an output switching device for receiving said delayed intermediate signal and outputting an output signal;
a first bypass device coupled to said first limiting device and said output signal for bypassing said first limiting device and presetting said intermediate signal; and
a second bypass device coupled to said second limiting device and said output signal for bypassing said second limiting device and resetting said intermediate signal.

32. A memory device comprising:
a memory array:
a plurality of control signals coupled to said memory array; and
a delay circuit for delaying one of said plurality of control signals, comprising an input signal, said delay circuit comprising:
an input switching device for receiving said input signal and outputting an intermediate signal, said input switching device comprising an inverter including a PMOS transistor having a gate node coupled to said input signal and a drain node coupled to said intermediate signal and an NMOS transistor having a gate node coupled to said input signal and a drain node coupled to said intermediate signal;
a first limiting device coupled to said input switching device for limiting speed of falling edge transitions from said input signal through said input switching device, wherein said first limiting device comprises another PMOS transistor having a source node coupled to power, $V_{DD}$, a drain node and a gate node both coupled to a source node of said PMOS transistor;

a second limiting device coupled to said input switching device for limiting speed of rising edge transitions from said input signal through said input switching device;

an RC network for receiving said intermediate signal and outputting a delayed intermediate signal;

an output switching device for receiving said delayed intermediate signal and outputting an output signal;

a first bypass device coupled to said first limiting device and said output signal for bypassing said first limiting device and presetting said intermediate signal; and a second bypass device coupled to said second limiting device and said output signal for bypassing said second limiting device and resetting said intermediate signal.

33. The memory device according to claim 28, wherein said second bypass device comprises another NMOS transistor having a source node coupled to ground potential, GND, a gate node coupled to said output signal and a drain node coupled to a source node of said NMOS transistor.

34. The memory device according to claim 28, wherein said second limiting device comprises another NMOS transistor having a source node coupled to ground potential, GND, a gate node coupled to power, $V_{DD}$, and a drain node coupled to a source node of said NMOS transistor.

35. A memory device comprising:

a memory array:

a plurality of control signals coupled to said memory array; and a delay circuit for delaying one of said plurality of control signals, comprising an input signal, said delay circuit comprising:

an input switching device for receiving said input signal and outputting an intermediate signal, said input switching device comprising an inverter including a PMOS transistor having a gate node coupled to said input signal and a drain node coupled to said intermediate signal and an NMOS transistor having a gate node coupled to said input signal and a drain node coupled to said intermediate signal;

a first limiting device coupled to said input switching device for limiting speed of falling edge transitions from said input signal through said input switching device;

a second limiting device coupled to said input switching device for limiting speed of rising edge transitions from said input signal through said input switching device, wherein said second limiting device comprises another NMOS transistor having a source node coupled to ground potential, GND, a gate node coupled to said intermediate signal, and a drain node coupled to a source node of said NMOS transistor;

an RC network for receiving said intermediate signal and outputting a delayed intermediate signal;

an output switching device for receiving said delayed intermediate signal and outputting an output signal;

a first bypass device coupled to said first limiting device and said output signal for bypassing said first limiting device and presetting said intermediate signal; and a second bypass device coupled to said second limiting device and said output signal for bypassing said second limiting device and resetting said intermediate signal.

36. A memory device comprising:

a memory array:

a plurality of control signals coupled to said memory array; and a delay circuit for delaying one of said plurality of control signals, comprising an input signal, said delay circuit comprising:

an input switching device for receiving said input signal and outputting an intermediate signal, said input switching device comprising an inverter including a PMOS transistor having a gate node coupled to said input signal and a drain node coupled to said intermediate signal and an NMOS transistor having a gate node coupled to said input signal and a drain node coupled to said intermediate signal;

a first limiting device coupled to said input switching device for limiting speed of falling edge transitions from said input signal through said input switching device;

a second limiting device coupled to said input switching device for limiting speed of rising edge transitions from said input signal through said input switching device, wherein said second limiting device comprises another NMOS transistor having a source node coupled to ground potential, GND, a drain node and a gate node both coupled to a source node of said NMOS transistor;

an RC network for receiving said intermediate signal and outputting a delayed intermediate signal;

an output switching device for receiving said delayed intermediate signal and outputting an output signal;

a first bypass device coupled to said first limiting device and said output signal for bypassing said first limiting device and presetting said intermediate signal; and a second bypass device coupled to said second limiting device and said output signal for bypassing said second limiting device and resetting said intermediate signal.

37. A computer system comprising:

an input device;

an output device; and a processor coupled to said input device and said output device, said processor having a delay circuit associated therewith, said delay circuit comprising:

an input switching device for receiving an input signal and outputting an intermediate signal;

a first limiting device controlled by said intermediate signal and coupled to said input switching device for limiting speed of falling edge transitions from said input signal through said input switching device;

a second limiting device controlled by said intermediate signal and coupled to said input switching device for limiting speed of rising edge transitions from said input signal through said input switching device;

an RC network for receiving said intermediate signal and outputting a delayed intermediate signal;

an output switching device for receiving said delayed intermediate signal and outputting an output signal;

a first bypass device coupled to said first limiting device and said output signal for bypassing said first limiting device and presetting said intermediate signal; and a second bypass device coupled to said second limiting device and said output signal for bypassing said second limiting device and resetting said intermediate signal.

38. A computer system comprising:

an input device;

an output device;

a processor coupled to said input device and said output device; and a memory device coupled to said processor, said memory device having a delay circuit associated therewith, said delay circuit comprising:

an input switching device for receiving an input signal and outputting an intermediate signal;

a first limiting device controlled by said intermediate signal and coupled to said input switching device for limiting speed of falling edge transitions from said input signal through said input switching device;

a second limiting device controlled by said intermediate signal and coupled to said input switching device for limiting speed of rising edge transitions from said input signal through said input switching device;

an RC network for receiving said intermediate signal and outputting a delayed intermediate signal;

an output switching device for receiving said delayed intermediate signal and outputting an output signal;

a first bypass device coupled to said first limiting device and said output signal for bypassing said first limiting device and presetting said intermediate signal; and a second bypass device coupled to said second limiting device and said output signal for bypassing said second limiting device and resetting said intermediate signal.

39. A substrate including a delay element, said delay element comprising:

an input switching device for receiving an input signal and outputting an intermediate signal;

a first limiting device controlled by said intermediate signal and coupled to said input switching device for limiting speed of falling edge transitions from said input signal through said input switching device;

a second limiting device controlled by said intermediate signal and coupled to said input switching device for limiting speed of rising edge transitions from said input signal through said input switching device;

an RC network for receiving said intermediate signal and outputting a delayed intermediate signal;

an output switching device for receiving said delayed intermediate signal and outputting an output signal;

a first bypass device coupled to said first limiting device and said output signal for bypassing said first limiting device and presetting said intermediate signal; and a second bypass device coupled to said second limiting device and said output signal for bypassing said second limiting device and resetting said intermediate signal.

40. A method of preconditioning an internal signal of a delay circuit comprising:

receiving an edge of an input signal;

propagating said edge to generate an intermediate signal;

limiting switching speed of said input switching device in direct response to said intermediate signal;

delaying said edge to generate a delayed intermediate signal;

driving an output signal after said delayed intermediate signal reaches a threshold voltage; and feeding back said output signal to precondition said intermediate signal for another edge propagation.

41. The method according to claim 40, wherein said delaying said edge to generate said delayed intermediate signal further comprises limiting current to said delayed edge.

* * * * *

UNITED STATES PATENT AND TRADEMARK OFFICE
CERTIFICATE OF CORRECTION

PATENT NO. : 6,801,073 B2      Page 1 of 4
APPLICATION NO. : 10/179606
DATED : October 5, 2004
INVENTOR(S) : Donald M. Morgan It is certified that error appears in the above-identified patent and that said Letters Patent is hereby corrected as shown below:

On the title page:
In item (57) Abstract,    4th LINE,    change "gate to source" to --gate-to-source--
In item (57) Abstract,    9th LINE,    change "gate to source" to --gate-to-source--

In the drawings:
         FIGURE 7,    insert reference numeral --700-- and appropriate lead line Delete FIG. 7 and replace FIG. 7 with the following corrected figure:

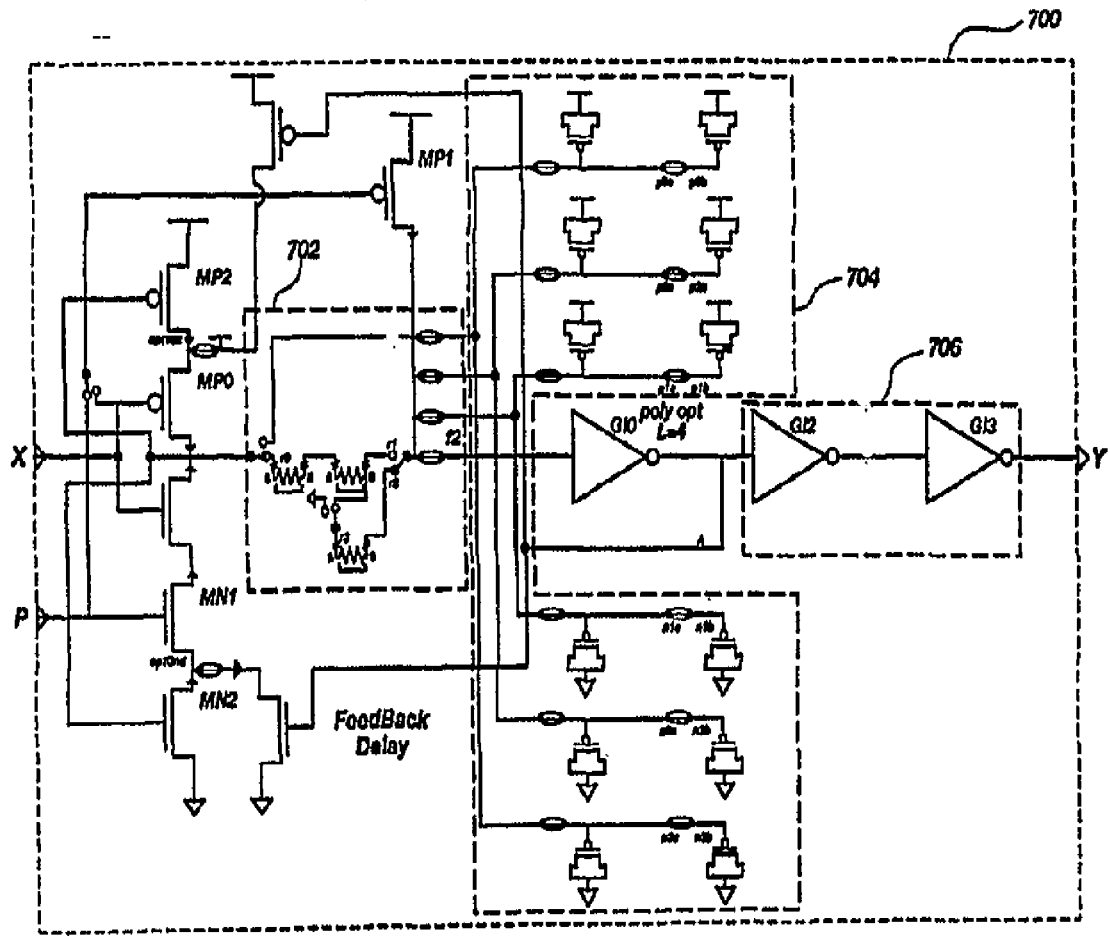

Fig. 7

UNITED STATES PATENT AND TRADEMARK OFFICE
CERTIFICATE OF CORRECTION

PATENT NO.       : 6,801,073 B2
APPLICATION NO.  : 10/179606
DATED            : October 5, 2004
INVENTOR(S)      : Donald M. Morgan It is certified that error appears in the above-identified patent and that said Letters Patent is hereby corrected as shown below:

In the specification:

| | | |
|---|---|---|
| COLUMN 1, | LINE 9, | change "for low" to --for a low-- |
| COLUMN 1, | LINE 34, | change "In this way" to --In this way,-- |
| COLUMN 1, | LINE 39, | change "terms "tied"," to --terms "tied,"-- |
| COLUMN 1, | LINE 42, | change "source tied" to --source node tied-- |
| COLUMN 1, | LINE 54, | change "capacitor C1" to --capacitor C-- |
| COLUMN 1, | LINE 56, | change "with input" to --with an input-- |
| COLUMN 1, | LINE 61, | change "$t_{dl,}$" to --$\Delta t_{dl}$,-- |
| COLUMN 1, | LINE 64, | change "capacitor Cl" to --capacitor C-- |
| COLUMN 2, | LINE 4, | change "high frequency" to --high-frequency-- |
| COLUMN 2, | LINE 7, | change "network 100" to --circuit 100-- and change "typically" to --generally-- |
| COLUMN 2, | LINE 9, | change "resistor R1 and capacitor C1" to --resistor R and capacitor C-- |
| COLUMN 2, | LINE 13, | change "for low" to --for a low-- |
| COLUMN 2, | LINE 20, | change "for low" to --for a low-- |
| COLUMN 2, | LINE 59, | change "circuit 700" to --circuit-- |
| COLUMN 3, | LINE 7, | change "for low" to --for a low-- |
| COLUMN 3, | LINE 9, | change "gate to source" to --gate-to-source-- |
| COLUMN 3, | LINE 14, | change "gate to source" to --gate-to-source-- |
| COLUMN 3, | LINE 17, | change "pre-conditioning" to --preconditioning-- |
| COLUMN 3, | LINE 26, | after "source" insert --node-- |
| COLUMN 3, | LINE 33, | change "signal, IN and" to --signal IN, and-- |
| COLUMN 3, | LINE 39, | change "and to the other end of" to --and the other end tied to-- |
| COLUMN 3, | LINE 41, | change "with input" to --with an input-- and change "and output driving" to --and an output driving-- |
| COLUMN 3, | LINE 48, | change "referred to as" to --referred to herein as-- |
| COLUMN 3, | LINE 49, | change "referred to as" to --referred to herein as-- |
| COLUMN 3, | LINE 50, | change "signal O," herein." to --signal O."-- |
| COLUMN 3, | LINE 52, | change "signal"." to --signal."-- |
| COLUMN 3, | LINE 67, | change "pre-charging" to --precharging-- |
| COLUMN 4, | LINE 2, | change "P1 when" to --P1, when-- |

UNITED STATES PATENT AND TRADEMARK OFFICE
CERTIFICATE OF CORRECTION

PATENT NO. : 6,801,073 B2
APPLICATION NO. : 10/179606
DATED : October 5, 2004
INVENTOR(S) : Donald M. Morgan It is certified that error appears in the above-identified patent and that said Letters Patent is hereby corrected as shown below:

In the specification (continued):

| | | |
|---|---|---|
| COLUMN 4, | LINE 13, | change "N2 when" to --N2, when-- |
| COLUMN 4, | LINE 26, | change "signal O is" to --signal O, is-- |
| COLUMN 4, | LINE 43, | delete the comma after "$\Delta t_3$" |
| COLUMN 4, | LINE 49, | change "pre-conditioned" to --preconditioned-- |
| COLUMN 4, | LINE 56, | change "$\Delta t_{d1}$," to -- $\Delta t_{dl}$-- |
| COLUMN 4, | LINE 61, | change "pre-conditioning for high speed" to --preconditioning for high-speed-- |
| COLUMN 5, | LINE 2, | change "internal" to --intermediate-- |
| COLUMN 5, | LINE 10, | change "limiting device," to --limiting device-- |
| COLUMN 5, | LINE 21, | delete the comma after "$\Delta t_4$" |
| COLUMN 5, | LINE 22, | change "allows" to --allow-- |
| COLUMN 5, | LINE 26, | change "$\Delta t_{d4}$" to -- $\Delta t_{d4}$,-- |
| COLUMN 5, | LINE 27, | change "convention" to --conventional-- |
| COLUMN 5, | LINE 33, | change "limiting devices, PMOS" to --limiting devices PMOS-- |
| COLUMN 6, | LINE 12, | change "Of course" to --Of course,-- |
| COLUMN 6, | LINE 17, | change "in the art, thus," to --in the art; thus,-- |
| COLUMN 6, | LINE 40, | change "in the art," to --in the art;-- |
| COLUMN 6, | LINE 44, | change "edge of" to --edge 802 of-- |
| COLUMN 6, | LINE 45, | change "edge through" to --edge 804 through-- |
| COLUMN 6, | LINE 46, | change "limiting the" to --limiting 806 the-- |
| COLUMN 6, | LINE 48, | change "edge to" to --the edge 808 to-- |
| COLUMN 6, | LINE 49, | change "signal after" to --signal 810 after-- |
| COLUMN 6, | LINE 51, | change "back the" to --back 812 the-- and change "pre-condition" to --precondition-- |

UNITED STATES PATENT AND TRADEMARK OFFICE
CERTIFICATE OF CORRECTION

PATENT NO. : 6,801,073 B2
APPLICATION NO. : 10/179606
DATED : October 5, 2004
INVENTOR(S) : Donald M. Morgan It is certified that error appears in the above-identified patent and that said Letters Patent is hereby corrected as shown below:

In the specification (continued):
COLUMN 7, LINE 28, change "limitation a" to --limitation, a--

Signed and Sealed this

Twenty-second Day of May, 2007

JON W. DUDAS
*Director of the United States Patent and Trademark Office*